April 13, 1965 D. J. STAMBAUGH 3,177,671

THERMOELECTRIC DEVICE

Filed June 12, 1963 4 Sheets-Sheet 1

INVENTOR.

DAVID J. STAMBAUGH,

BY

Trask, Jenkins & Hanley

ATTORNEYS.

THERMOELECTRIC DEVICE

Filed June 12, 1963 4 Sheets-Sheet 2

INVENTOR.
DAVID J. STAMBAUGH,
BY
Trask, Jenkins & Hanley
ATTORNEYS.

THERMOELECTRIC DEVICE

Filed June 12, 1963

INVENTOR.
DAVID J. STAMBAUGH,
BY
Trask Jenkins & Hanley
ATTORNEYS.

April 13, 1965 D. J. STAMBAUGH 3,177,671

THERMOELECTRIC DEVICE

Filed June 12, 1963 4 Sheets-Sheet 4

INVENTOR.
DAVID J. STAMBAUGH,
BY
Trask, Jenkins & Hanley
ATTORNEYS.

3,177,671
Patented Apr. 13, 1965

3,177,671

THERMOELECTRIC DEVICE

David J. Stambaugh, Columbus, Ind., assignor to Arvin Industries, Inc., Columbus, Ind., a corporation of Indiana Filed June 12, 1963, Ser. No. 287,230
13 Claims. (Cl. 62—3)

This invention relates to a thermoelectric device, and more particularly to a thermoelectric refrigerator and a thermoelectric module therefor.

It is an object of the invention to provide a thermoelectric refrigerator which can operate on direct or alternating current, which will provide refrigerating and freezing compartments, which will be efficient in its operation, and which will be of attractive appearance and compact size. It is a further object of the invention to provide a thermoelectric module which will efficiently generate heat and cold, which can be easily mounted in a refrigerator, and which will be of compact size.

According to one form of the invention, there is provided a cabinet formed from inner and outer shells separated by a layer of insulation. The cabinet has an open side which is closed by an insulated door hingedly mounted thereon. Desirably, a compartment is provided within the cabinet which constitutes a freezing compartment, with the remainder of the cabinet interior serving as a refrigerating compartment.

The interior of the cabinet is cooled by a plurality of thermoelectric modules which are conveniently mounted in one of the cabinet side walls. Each of the modules comprises a pair of metallic plates electrically interconnected to pairs of dissimilar metallic members extending between said plates. One of said plates is in intimate thermoconductive relationship with a thermoconductive block projecting outwardly from one side of the module, and the other metallic plate is in intimate thermoconductive relationship with a heat exchanger projecting outwardly from the opposite side of the module. A body of thermoinsulating material encapsulates the portions of the block and heat exchanger adjacent the pair of plates and the portions of said pair of plates which are in intimate thermoconductive relationship with said block and heat exchanger. Each of the modules is mounted on the outer cabinet shell with its body of thermoinsulating material projecting through an opening in the outer shell and the layer of insulation separating the inner and outer cabinet shells. The inwardly presented ends of the thermoconductive blocks on a plurality of the modules are connected to a thermoconductive sheet carried within the freezing compartment, and the inwardly presented ends of the thermoconductive blocks on another plurality of the modules are connected to another thermoconductive sheet mounted within the refrigerating compartment of the cabinet. The heat exchangers on the modules project outwardly from the outer shell of the cabinet into a housing mounted on the cabinet. Said housing has open upper and lower ends to provide a chimney effect for the movement of air over the heat exchangers.

Each of the modules is connected to an electric circuit adapted to be connected to a power source, A.C. or D.C., for supplying electrical power to the modules. Conveniently, a thermostat for controlling the operation of the modules is mounted within the cabinet and connected into said circuit.

Other objects and features of the invention will become apparent from the more detailed description which follows and from the accompanying drawings, in which.

Figure 1:
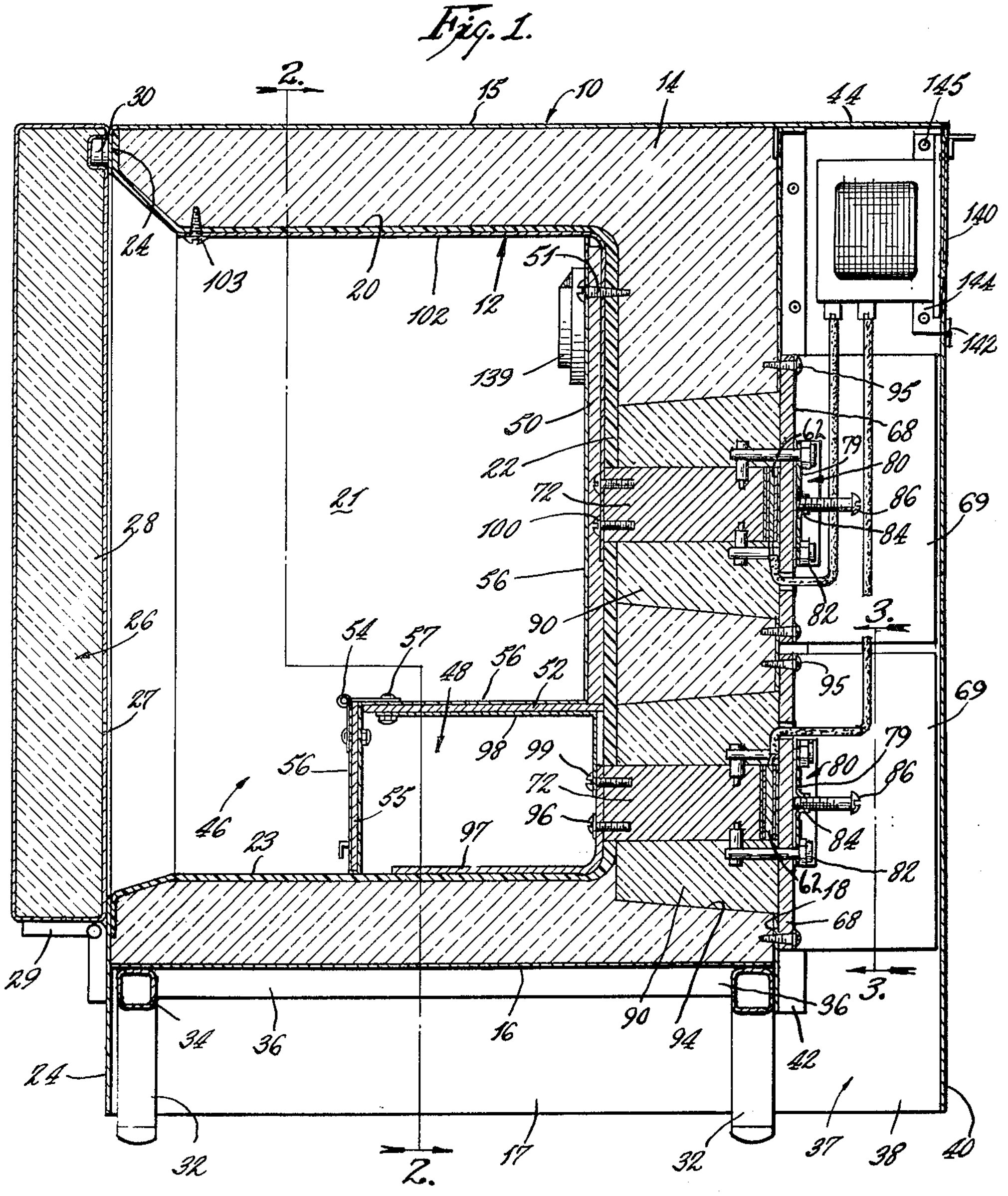
FIG. 1 is a vertical section taken on the line 1—1 of FIG. 2 and showing a thermoelectric refrigerator embodying the invention.
Figure 2:
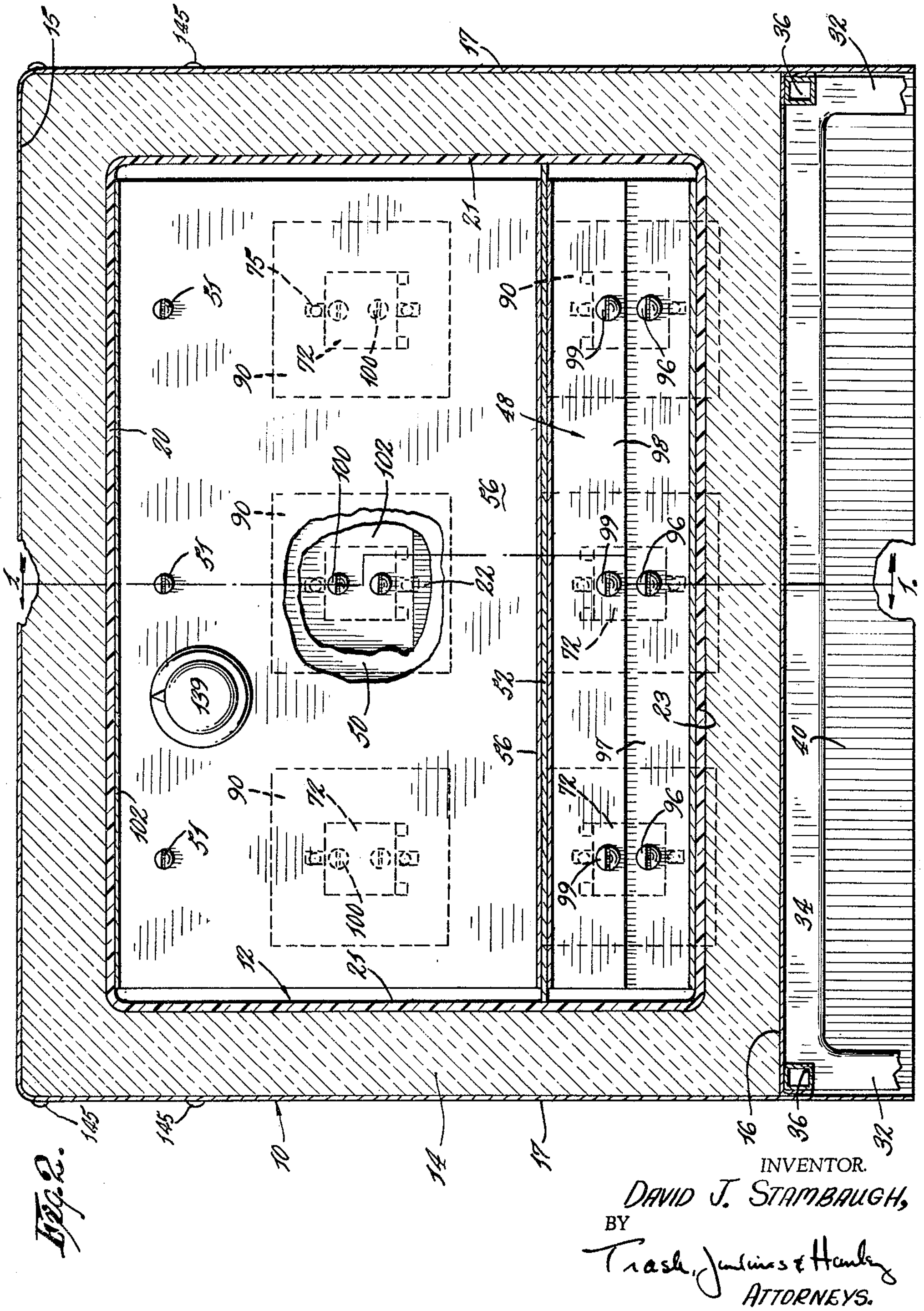
FIG. 2 is a vertical section taken on the line 2—2 of FIG. 1.

As shown in FIG. 1, the refrigerator comprises a cabinet having one of its sides open and formed from outer and inner shells 10 and 12 separated by a layer of insulation 14. The outer shell 10 forms the cabinet outer top and bottom walls 15 and 16 which are interconnected to side walls 17 and a back wall 18. The inner shell 12, which is conveniently formed as a plastic molding, forms the interior walls of the cabinet and includes a top wall 20, side walls 21, rear wall 22, and bottom wall 23. The forward edges of the inner shell top and bottom walls 20 and 23 are connected to the forward edges of the outer shell 10 around the edges of the open front side of the cabinet. The forward edges of the outer shell top wall 15 and side walls 17 are bent, as at 24, to form a border around the open front side of the cabinet. The opening in the cabinet is enclosed by a door 26 formed from sheet-metal shell 27 filled with insulation 28 and connected along its lower edges to the cabinet by hinges 29. Conveniently, the door 26 is releasably locked in a closed position against the border 24 by a magnetic lock 30.

The cabinet is supported on a base frame comprising a plurality of ground-engaging legs 32 interconnected to transverse and longitudinal stretches 34 and 36 upon which the cabinet bottom wall 16 is mounted. For reasons that will become more apparent hereinafter, a housing 37 projects rearwardly from the cabinet. The housing comprises side panels 38 interconnected at their rear ends by a back plate 40 and connected to the cabinet by vertically extending brackets 42 mounted on the cabinet back wall 18. The lower end of the housing 37 is open and the rear portion of the top cabinet wall 15, is grated at 44 and extends over the upper end of said housing thereby providing said housing with an open ended construction.

The interior of the cabinet is divided into a refrigerating compartment generally indicated at 46 and a freezing compartment generally indicated at 48. To form these compartments, a plate 50 is mounted on the inner shell rear wall 22, as by screws 51. As shown in FIG. 1, the lower end of the plate 50 is disposed well above the bottom wall 23 and is interconnected to a horizontally disposed forwardly projecting wall 52 forming the top of the freezing compartment 48. Conveniently, the wall 52 extends the width of the inner shell to abut the side walls 21 so that said side walls also form the side walls of the freezing compartment. A door 55 extending the width of the inner shell 12 is connected by hinges 54 to the forward end of the wall 52. As shown in FIG. 1, the lower end of the door 55 abuts the bottom wall 23 when said door is in its closed position. In order to facilitate cleaning and enhance the interior appearance of the refrigerator, plates 56 are mounted on the freezing compartment door 55, the wall 52, and plate 50 by the hinge bolts 57 and the plate screws 51.

Figures 3, 4:
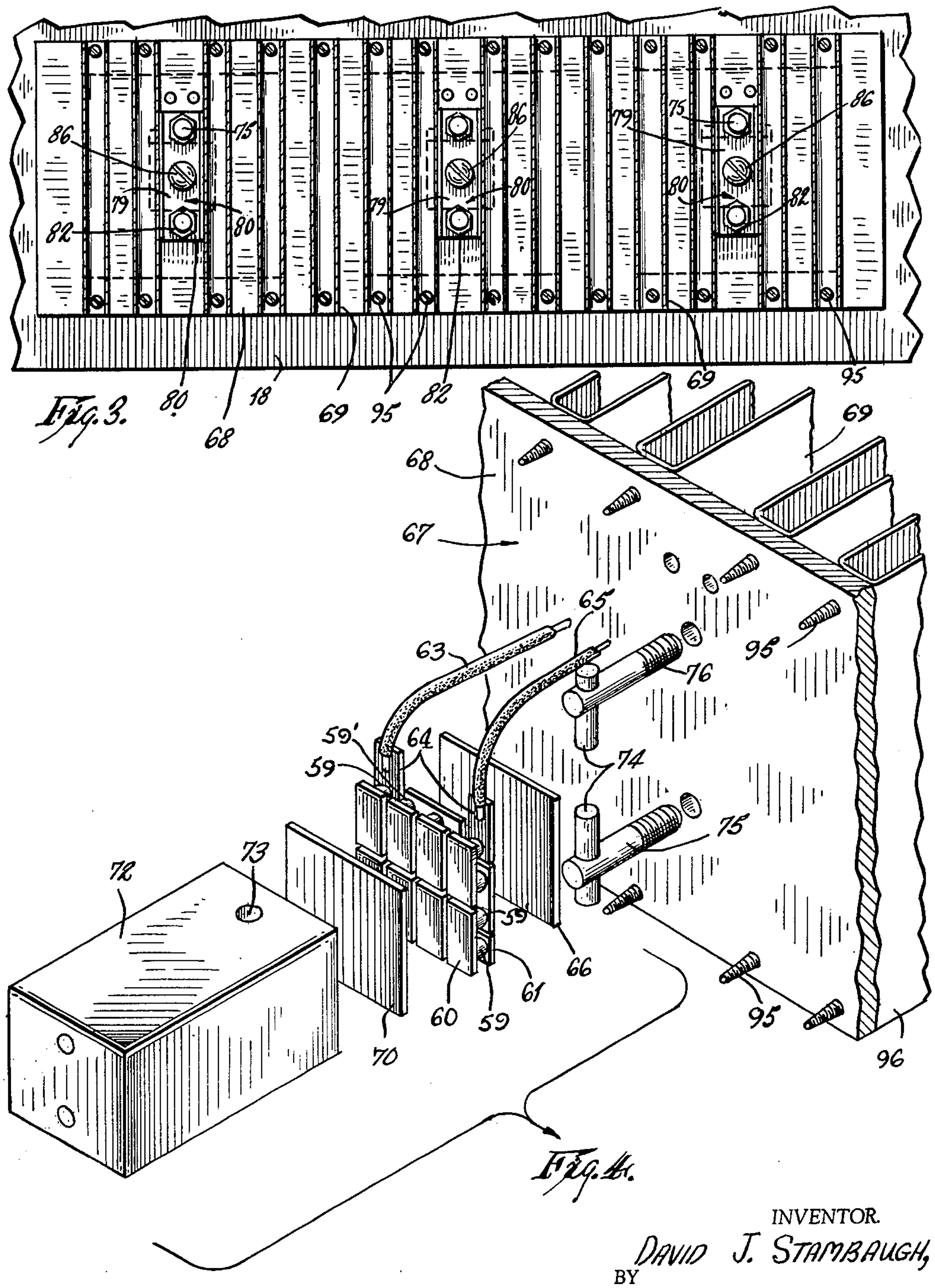
FIG. 3 is a fragmentary vertical section taken on the line 3—3 of FIG. 1.
FIG. 4 is an exploded isometric view of one of the thermoelectric modules shown in FIG. 1.

The air within the cabinet is refrigerated by a plurality of thermoelectric modules. As shown in FIG. 4, each of the modules comprises a pair of metallic plates 60 and 61 formed from a plurality of platelets electrically interconnected in series by a plurality of pairs of dissimilar metallic rods 59 and 59' conveniently formed from bismuth telluride treated with suitable materials in order for them to produce a thermoelectric effect. A layer of rigid foam 62 (omitted in FIG. 4) is interposed between the plates 60 and 61 around the rods 59, with the plate 61 having a pair of terminals 64 connected to leads 63 and 65. A thin sheet 66 of electrical insulation such as "Mylar" or mica, extends over the rearwardly presented face of the plate 61 and abuts a heat exchanger 67. As shown, the heat exchanger 67 comprises a base plate 68 abutting the sheet 66 in face-to-face contact and connected to a plurality of rearwardly projecting sheet-metal fins 69. A second sheet 70 of the thin electrical insulation is disposed over the forwardly presented face of the plate 60 and is in abutting face-to-face contact with a rectangular block 72 of thermoconductive material, conveniently a block of aluminum. A pair of pins 74 connected to rearwardly extending bolts 75 are rigidly mounted in openings 73 in a pair of opposed faces of the block 72. The pins 74 and bolts 75 are formed from an insulating material having a low heat conductivity.

To assemble the module, the block 72 and heat exchanger base 68 are brought toward the plates 60 and 61 with the sheets 70 and 66 interposed between said plates and the block and heat exchanger base. The bolts 75, which extend rearwardly from the block 72, project through aligned openings formed in the heat exchanger base 68 and the web 79 of a U-shaped bracket 80 carried against the rear face of the base 68 between a pair of adjacent fins 69. Nuts 82 are drawn up on the bolts 75 to cause the bracket 80 to bear against the rearward face of the plate 68 and to draw the plate 68 and block 72 into intimate thermoconductive relationship with the plates 61 and 60. In the operation of the thermoelectric module, it is essential that the entire faces of the plates 60 and 61 be in intimate thermoconductive relationship with the block 72 and heat exhanger 67. Therefore, to compensate for any discrepancy in the tightening of the nuts 82, the bracket 80 has a tapped sleeve 84 positioned intermediate the openings for the bolts 75 for the reception of bolt 86. Upon tightening, of the bolt 86, it bears against the rearwardly presented face of the heat exchanger base 68 to insure that the block 72 and heat exchanger 67 are in intimate thermoconductive relationship with the module plates 60 and 61 over the entire extent of said plates.

After the module has been assembled in the manner just described, it is placed in a mold and a body 90 of insulation is applied thereto. As shown in FIG. 1, the insulating body 90 has a generally frustoconical configuration and completely encapsulates the plates 60 and 61 and the adjacent portions of the heat exchanger base 68 and block 72. The modules are mounted in the refrigerator by inserting their insulating bodies 90 through openings formed in the cabinet back wall 18 and into cored openings 94 formed in the cabinet insulation 14. The openings 94 also have frustoconical configurations but of slightly smaller diameters than the diameters of the bodies 90 so that said modules are press-fit into the openings 94. The modules are further secured to the cabinet by screws 95 extending through the heat exchanger base 68 and received in the cabinet back wall 18.

The modules are mounted in the cabinet in a pair of horizontally disposed banks, with the lower bank of said modules being disposed within the vertical extent of the freezing compartment 48, and the upper bank of modules being disposed within the vertical extent of the refrigerating compartment 46. The insulating bodies 90 bear against the rearwardly presented face of the inner cabinet back wall 22, and the blocks 72 on the lower bank of modules project through the wall 22. The inner faces of the blocks are connected by screws 96 in face-to-face engagement with an L-shaped metallic sheet 97 extending along the bottom wall of the freezing compartment and the lower portion of the rear freezing compartment wall and providing a contact-freeze surface, as for ice cube trays. Similarly, a second Lshaped metallic sheet 98 is also connected by screws 99 in face-to-face engagement with the inner ends of the blocks 72 in the lower bank of modules. The sheet 98 extends along the upper freezing compartment wall and upper portion of the back freezing compartment wall. In a like manner, the inwardly presented ends of the blocks 72 on the upper bank of modules are connected by screws 100 in face-to-face engagement with an L-shaped sheet of metal 102 extending between the plate 50 and the inner shell rear wall 22 and against the inner shell top wall 20 within the extent of the refrigerating compartment 46. Conveniently, the sheet 102 is further secured in place by the screws 51 and by screws 103.

Figure 5:
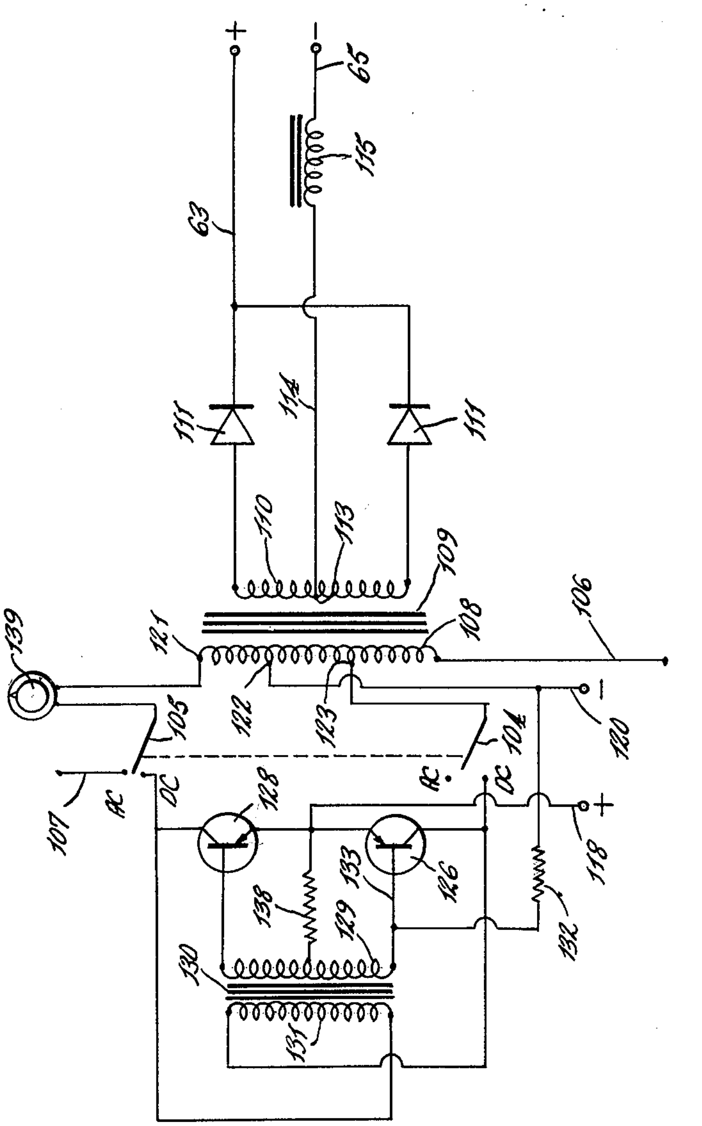
FIG. 5 is a schematic diagram of the electric circuit for the thermoelectric modules.

The modules must be energized by a direct current supply, and to this end, I provide the circuit shown in FIG. 5 which permits the refrigerator to be connected directly to a D.C. or A.C. power source. As shown, the circuit comprises a pair of switch arms 104 and 105 engageable with a pair of A.C. contacts connected to A.C. line cords 106 and 107. The 114 volt 60 cycle A.C. from the lines 106 and 107 goes through the primary 108 of a transformer 109 whose secondary 110 steps down the voltage out of each end of the transformer. The secondary 110 is connected to a pair of half wave rectifiers 111 which change the alternating current to a pulsating direct current which is transmitted by line 63 to one of the terminals 64 on the plates 61 of the modules. The center tap 113 of the transformer 109 is connected to one end of a line 114 connected to a choke 115 for reducing the current ripple to 10%, said choke being connected to lead 65 on the other terminal 64 on the plates 61 of the several modules. In this manner, the refrigerator lines 106 and 107 can be connected directly to a conventional alternating current source for energizing the modules.

For direct current operation, the switch arms 104 and 105 are closed against a pair of D.C. contacts, and connections are made to the positive and negative sides of a battery by lines 118 and 120. In D.C. operation, the taps 121, 122, and 123 on the primary 108 of transformer 109 are employed. The line 118 is connected to the emitters of transistors 126 and 128 and to the secondary 129 of an excitation transformer 130. A resistor 132 having one of its ends connected to the line 120 and its opposite end connected to the line 133 between the collector of transistor 126 and transformer secondary 129 provides a negative bias to the base of the transistor 126 permitting current to flow out of the collector of transistor 126. This causes a downward surge through the primary 131 of transformer 130 causing a more negative bias through the lower portion of the center tapped transformer secondary 129. When the transistor 126 is fully conducting and there ceases to be a rate of current flow, the field of the primary 131 collapses and cuts off the bias of transistor 126 and creates a bias on transistor 128 through the center tapped secondary 129. Then an upward surge causes the transistor 128 to conduct and the whole cycle repeats itself in the opposite direction. When the transistors 126 and 128 are fully conducting, they are substantially shorted so that the resistor 132 effectively drops out of the circuit. As the transistors 126 and 128 switch back and forth at a rate of about 400 cycles per second (the rate depending upon the value of the resistor 138) the current is pulsing up and down between the taps 121, 122, and 123 of primary 108 of transformer 109. Upon reception of the pulsating current to the primary of transformer 109, said transformer transmits to its secondary 110 where the current is rectified by the diodes 111 and straightened to a 10% ripple by the choke 115 in the same manner as when an alternating current is transmitted to the transformer primary 108 through the lines 106 and 107.

With the lines 63 and 65 supplying current to the modules, the module plates 60 and 61 will exhibit their thermoelectric effect. The polarity of the current supplied to the modules is such that the plates 60 will be at a reduced temperature and the plates 61 will be at an elevated temperature. In this manner, the refrigerating effect of the plates 60 will be transmitted through the blocks 72 and their associated plates 97, 98, and 102 to the interior of the refrigerator, and the heat generated in the plates 61 will be transmitted to the heat exchangers 67. The heat exchangers being located within the housing 37, however, will have the heat rapidly removed therefrom due to the rapid movement of air thereover causing the open-ended chimney effect of said housing. Of course, if it were desired to employ the refrigerator as an oven, it would merely be necessary to reverse the polarity of the current supplied to the modules, in which event, the plates 60 would become heat generating and the plates 61 refrigerating.

The modules in both banks are wired in series with each other, and a thermostat 139 is connected into the circuit between the switch 105 and the primary 108 of transformer 109. Desirably, the sensing element of the thermostat senses the temperature of the freezing compartment sheet 97 for controlling the current supplied to the several modules. In normal operation, the thermostat 139 will be set to cause the plate 97 to be maintained at a temperature well below freezing to maintain the freezing compartment at sub-freezing temperatures. Since all of the modules are in series, the plate 102 will also be maintained at sub-freezing temperatures, but due to the larger volume of the compartment 46 as contrasted to the compartment 48, the plate 102 will maintain the compartment 46 at temperatures above freezing.

The various components of the circuit shown in FIG. 5 are mounted on a plate 140 hingedly connected to the back plate 40, as at 142. As shown in FIG. 1, the plate 140 has forwardly projecting flanges 144 at its lateral ends which are connected to the side walls 38 of the housing 37 as by screws 145. Thus, by removing the screws 145, the plate 140 may be swung downwardly for obtaining access to the various circuit components for any repair or replacement that may be necessary.

I claim:

1. A thermoelectric refrigerator, comprising
*a.* a cabinet having one of its sides open,
*b.* a door hingedly mounted on said cabinet for closing the open side thereof,
*c.* said cabinet having walls formed from inner and outer shells separated throughout substantially their entire extent by insulating material,
*d.* a plurality of thermoelectric modules mounted in said cabinet walls, each comprising a pair of metallic plates electrically interconnected to each other by pairs of dissimilar metallic members with one of said plates in intimate thermocoupling relationship with a heat exchanger disposed outside the extent of said outer shell and the other of said plates in intimate thermocoupling relationship with a thermoconductive block extending through openings formed in said insulating material and said inner shell to dispose its inner end with the interior of said cabinet, said inner block end being the only component of said module within the interior of said cabinet,
*e.* means electrically insulating said block and heat exchanger from said pair of plates,
*f.* at least one thermoconductive sheet supported against the inner wall of said inner shell and connected in face-to-face contact with the ends of said blocks remote from said heat exchangers, and
*g.* means for supplying electric power to each pair of said metallic plates.

2. A thermoelectric refrigerator, comprising
*a.* a cabinet having one of its sides open,
*b.* a door hingedly mounted on said cabinet for closing the open side thereof,
*c.* said cabinet having inner and outer shells separated throughout substantially their entire extent by insulating material,

*d.* said outer shell and insulating material along one side of said cabinet having a plurality of openings formed therein, each of the openings in said insulating material converging from said outer shell toward said inner shell,
*e.* a plurality of thermoelectric modules mounted in said cabinet, each of said modules comprising a pair of metallic plates electrically interconnected to each other by pairs of dissimilar metallic members with one of said plates in intimate thermocoupling relationship with a heat exchanger disposed outside the extent of said outer shell and the other of said plates in intimate thermocoupling relationship with a thermoconductive block extending through one of said openings in the insulation and an opening formed in said inner shell to dispose its inner end within the interior of said cabinet, said plates being electrically insulated from said heat exchanger and block and the portions of said block and plates interposed between said inner and outer shell being encapsulated in a tapered insulating body press-fit into one of said openings in said insulating material,
*f.* at least one thermoconductive sheet supported against the inner wall of said inner shell and connected in face-to-face contact with the ends of said blocks remote from said heat exchangers, and
*g.* means for supplying electric power to the pairs of said metallic plates.

3. The invention as set forth in claim 2 in which
*a.* the openings in said insulating material and said insulating bodies have frustoconical configurations, and
*b.* the inwardly presented ends of said insulating bodies abut the face of the inner shell wall adjacent the outer shell.

4. The invention as set forth in claim 2 in which
*a.* each of said modules has means on its heat exchanger for directly connecting said heat exchanger to said block and to said outer cabinet shell.

5. A thermoelectric refrigerator, comprising
*a.* a cabinet having one of its sides open,
*b.* a door hingedly mounted on said cabinet for closing the open side thereof,
*c.* said cabinet having inner and outer shells separated throughout substantially their entire extent by insulating material,
*d.* means forming a compartment within said cabinet,
*e.* a plurality of thermoelectric modules mounted in said cabinet, each comprising a pair of metallic plates electrically interconnected to each other by pairs of dissimilar metallic members with one of said plates in intimate thermocoupling relationship with a heat exchanger disposed outside the extent of said outer shell and the other of said plates in intimate thermocoupling relationship with a thermoconductive block extending through openings formed in said insulating material and said inner shell within the extent of said compartment,
*f.* a thermoconductive sheet carried within said compartment and connected in face-to-face contact with the inwardly presented ends of said blocks, and
*g.* means for supplying electric power to each pair of said metallic plates.

6. The invention as set forth in claim 5 in which
*a.* said compartment comprises a horizontally disposed wall abutting the inner shell at its rear and lateral edges and a door hingedly connected to the front edge of said wall, and
*b.* said thermoconductive sheet is disposed along the bottom of said compartment.

7. The invention as set forth in claim 6 with the addition that
*a.* a second thermoconductive sheet is connected in face-to-face contact with the inwardly presented ends of said blocks and extends along the face of said horizontally disposed wall presented toward said compartment.

8. A thermoelectric refrigerator, comprising

*a.* a cabinet having one of its sides open,

*b.* a door hingedly mounted on said cabinet for closing the open side thereof,

*c.* said cabinet having inner and outer shells separated throughout substantially their entire extent by insulating material,

*d.* upper and lower horizontally aligned banks of thermoelectric modules mounted in said cabinet, each module comprising a pair of metallic plates electrically interconnected to each other by pairs of dissimilar metallic members with one of said plates in intimate thermocoupling relationship with a heat exchanger disposed outside the extent of said outer shell and the other of said plates in intimate thermocoupling relationship with a thermoconductive block extending through an opening in said insulating material and the inner cabinet shell whereby the inner end of said block constitutes the only component of the module within the interior of said cabinet, said pair of plates being electrically insulated from said heat exchanger and block,

*e.* a compartment mounted within said cabinet having a top wall connected at its rear edge to the interior cabinet rear wall between said banks of modules and hingedly connected at its front edge to a door extending between the compartment top wall and the interior cabinet bottom wall,

*f.* a first thermoconductive sheet connected in face-to-face contact with the inwardly presented ends of the blocks in said lower bank of modules and forming an exposed surface within said compartment,

*g.* a second thermoconductive sheet connected in face-to-face contact with the inwardly presented ends of the blocks in said upper bank of blocks and forming an exposed surface within said cabinet outside the extent of said compartment, and

*h.* means for supplying electric power to each pair of said metallic plates.

9. A thermoelectric device, comprising

*a.* a pair of metallic plates, electrically interconnected by pairs of dissimilar metallic members,

*b.* a thermoconductive block disposed in thermoconductive relationship with one of said plates and projecting substantially outwardly therefrom,

*c.* a heat exchanger disposed in thermoconductive relationship with the other of said pair of plates,

*d.* means acting between said block and heat exchanger for retaining the same in intimate thermoconductive relationship with their respective plates,

*e.* means electrically insulating said block and heat exchanger from said pair of plates,

*f.* a body of thermal insulation encapsulating the portions of said block and heat exchanger adjacent the plates and the portions of said plates not in intimate thermoconductive relationship with said block and heat exchanger, and

*g.* terminals on one of said plates for electrically connecting said plates to a source of electric power.

10. A thermoelectric device, comprising

*a.* a pair of metallic plates electrically interconnected by pairs of dissimilar metallic members,

*b.* a thermoconductive block disposed in thermoconductive relationship with one of said plates and projecting substantially outwardly therefrom,

*c.* a heat exchanger comprising a base having one of its faces in thermoconductive relationship with the other of said plates and a plurality of fins projecting outwardly from its opposite face,

*d.* fastening means acting between said block and base for retaining the same in intimate thermoconductive relationship with their respective plates,

*e.* means electrically insulating said block and heat exchanger from said pair of plates,

*f.* a body of thermal insulation encapsulating the portion of said block and heat exchanger base adjacent the plates and the portions of the plates not in intimate thermoconductive relationship with said block and base, and

*g.* means for supplying electric power to said metallic plates.

11. A thermoelectric device as set forth in claim 9 in which

*a.* said fastening means comprises a pair of bolts operatively connected to said block and projecting therebeyond through openings formed in said base between a pair of said fins,

*b.* a bracket received between said pair of fins and having openings formed therein for the reception of said pair of bolts,

*c.* nuts threadably received on said pair of bolts, and

*d.* a third bolt threadably received in said bracket between said pair of bolts and projecting therethrough to act between said bracket and base to force said base into intimate thermoconductive relationship with said other plate.

12. A thermoelectric device as set forth in claim 11 with the addition that

*a.* said bolts and their connections to said block are covered with a layer of insulation.

13. A thermoelectric device as set forth in claim 10 in which

*a.* said base on the heat exchanger projects outwardly beyond said body of thermal insulation and is provided with mounting means for said device.

References Cited by the Examiner

UNITED STATES PATENTS

| | | | |
|---|---|---|---|
| 2,932,953 | 4/60 | Becket | 62—3 |
| 2,978,875 | 4/61 | Lackey | 62—3 |
| 2,991,628 | 7/61 | Tuck | 62—3 |
| 3,040,539 | 6/62 | Gaugler | 62—3 |

ROBERT A. O'LEARY, *Primary Examiner.*

WILLIAM J. WYE, *Examiner.*